United States Patent [19]

Barnes

[11] 3,907,394

[45] Sept. 23, 1975

[54] CIRCUIT SOCKET AND REMOVABLE PACKAGE

[75] Inventor: Ronald B. Barnes, Camp Hill, Pa.

[73] Assignee: E. I. Du Pont de Nemours and Company, Wilmington, Del.

[22] Filed: July 2, 1973

[21] Appl. No.: 375,375

[52] U.S. Cl. ........... 339/65; 339/17 CF; 339/217 S; 339/189

[51] Int. Cl.² ...................... H01R 13/62; H05K 1/04

[58] Field of Search .......... 339/17 C, 17 CF, 48, 49, 339/65, 66, 75, 91 F, 174, 176 R, 176 M, 189, 217 S, 53

[56] References Cited

UNITED STATES PATENTS

| | | | |
|---|---|---|---|
| 1,014,718 | 1/1912 | Parsons | 339/189 R X |
| 2,248,598 | 7/1941 | Yoder | 339/53 |
| 2,312,017 | 2/1943 | Ackerman | 339/189 R X |
| 2,402,941 | 7/1946 | Bixby | 339/53 |
| 3,149,264 | 9/1964 | Richards | 339/189 R X |
| 3,215,968 | 11/1965 | Herrmann | 339/217 S X |
| 3,293,590 | 12/1966 | Woolsey | 339/75 M X |
| 3,805,212 | 4/1974 | Landman et al. | 339/75 MP X |
| 3,808,582 | 4/1974 | Aldridge et al. | 339/99 R |

FOREIGN PATENTS OR APPLICATIONS

| | | | |
|---|---|---|---|
| 320,091 | 4/1957 | Germany | 339/176 R |

*Primary Examiner*—Roy D. Frazier
*Assistant Examiner*—Lawrence J. Staab

[57] ABSTRACT

A socket and removable circuit element are provided. The circuit element comprises a body having at least two substantially rigid leads disposed on opposite sides of the body, or adjacently on the same side. The socket comprises at least one member for mounting a plurality of socket terminals for slidably receiving the circuit element, the contact terminals preferably having tines with opposing contact surfaces for slidably receiving the circuit element leads and means for fixedly mounting said socket in electrical interconnection with an electrical circuit.

11 Claims, 6 Drawing Figures

CIRCUIT SOCKET AND REMOVABLE PACKAGE

BACKGROUND OF THE INVENTION

1. Field of the Invention

This invention relates to circuit elements, and particularly relates to removable circuit elements and sockets for mechanically mounting and electrically interconnecting said elements with other electrical circuits.

2. Description of the Prior Art

Packages or elements for circuits and sockets for removably receiving them are well known in the prior art. The introduction of integrated electronic circuits established requirements for sockets which could removably receive a circuit element having a plurality of leads or terminals and electrically interconnect the leads or terminals with other electronic circuits on a circuit board or sub-assembly. Such packages and sockets are the type described in U.S. Pat. No. 3,436,810, wherein a lead frame having terminal ends is welded to an integrated circuit wafer or chip and the terminal ends and wafer are encased within a carrier of plastic or ceramic materials. The side portion or carrier strip of the lead frame are removed by a stamping operation which simultaneously bends the leads so that they are parallel to one another. The resultant circuit element may then be inserted into a socket as is well known from the prior art. Leads of this type are frequently misaligned, bent or broken on insertion in or removal from the socket, rendering the circuit element contained therein useless. U.S. Pat. No. 2,189,874 describes an electron tube mounting which removably receives an electron tube fixed to a base which is slidable in two guides.

SUMMARY OF THE INVENTION

According to the present invention there is provided a socket for removably receiving a circuit element having a body and at least two adjacent leads disposed on at least one side of the body, the socket comprising at least one member having at least two adjacent contact terminals and guide means on at least one side of each contact terminal for receiving the contact leads of the circuit element when the element is inserted in the socket in a first direction and guiding the leads when the circuit element is slid in a second direction to engage in electrical connection with the contact terminals. Preferably the guide means comprise a plurality of recessed surfaces on at least one side of each contact terminal, and the contact terminals have at least one contact surface substantially in a plane with the guide means.

In a preferred embodiment, the circuit element may have a rectangular body and a plurality of leads disposed on opposite sides of the body, and the socket comprises opposing members having a plurality of spaced contact terminals. The contact terminals preferably comprise a pair of tines having opposing contact surfaces substantially in a plane with the guide means. The circuit element and socket provide numerous advantages over the prior art, e.g. the ridgid leads are not readily bent, and the element is readily inserted in the first direction and then slid in the second direction to engage in electrical connection with the contact terminals. Additional advantage is provided by the low profile of the socket and package which facilitates high density packaging of the circuit elements and sockets.

DETAILED DESCRIPTION OF THE INVENTION

Figures 1, 2, 3, 4, 5, 6:
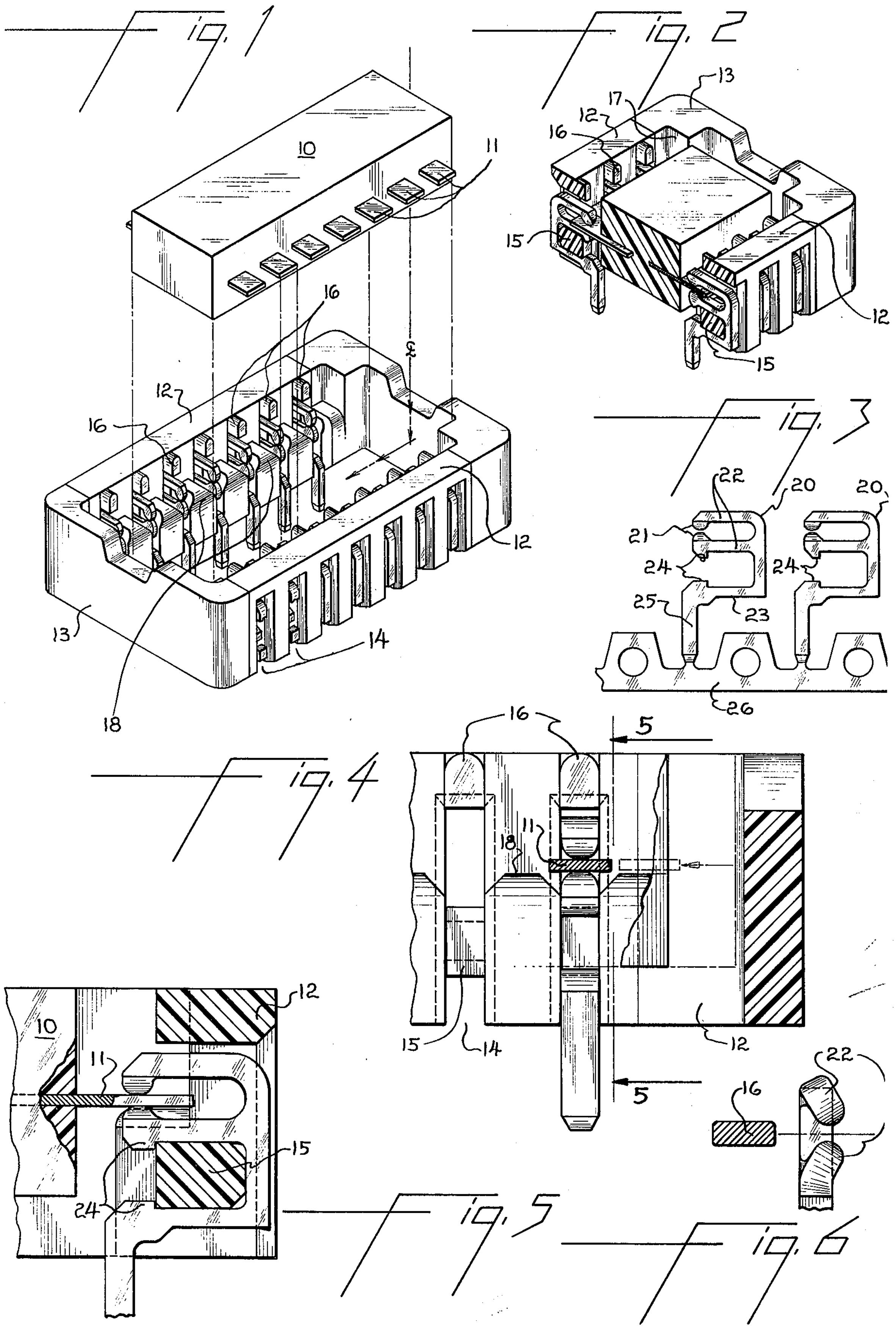
FIG. 1 is an perspective drawing illustrating a preferred embodiment of the socket and circuit element of the invention.
FIG. 2 is an perspective drawing in section of the circuit element inserted in the socket of the invention.
FIG. 3 is an elevation drawing of the contact terminals disposed on a removable carrier strip.
FIG. 4 is a side elevation drawing of the preferred embodiment of a circuit element inserted in a socket in partial section.
FIG. 5 is an elevation drawing in section taken along line 5—5 of FIG. 4.
FIG. 6 is a detailed drawing illustrating the canted tines and opposing contact surfaces of the preferred embodiment of the contact terminal of the socket of the invention.

The socket and circuit element of the invention are described with reference to the attached drawings, wherein the same numerals are used throughout to identify the same elements.

The circuit element comprises a body 10 having at least two terminals or leads 11 disposed on an adjacent side or opposite sides. The body may be of any shape, but is preferably rectangular as illustrated or square, having a low profile or thickness with the terminals or leads disposed at a mid-point of the thickness of said body. The body may be plastic or ceramic and may be fabricated, e.g., by providing a first lower section or carrier for receiving a semiconductor chip or other circuit component, e.g., resistor, capacitor, transistor, etc., and placing a lead frame comprising a plurality of conductive fingers with a perimeter carrier strip over said lower section. The circuit component may then be centrally mounted and interconnected to said leads, for example, by wire bonding. An upper section or cover may then be placed over the circuit component and sealed by methods well known in the art of fabricating circuit packages. The carrier strip or lead frame may then be trimmed or cut to separate it from the contact lead to provide the element. The circuit element of the invention is not limited by the method, means or materials of fabrication. For example, the lower section may be plastic or ceramic, or any other suitable insulating materials, the terminals or lead frame may be any suitable material having sufficient electrical conductivity and mechanical rigidity to provide for mounting the element in the socket of the invention, and the upper section may mate with the lower section to provide a rectangular package as illustrated or may be merely a cap over the circuit component. The element may or may not be hermetically sealed.

The socket housing comprises a pair of spaced opposing members 13 for mounting at least two opposing socket terminals 20. The opposing members may have end caps 13 as shown or may be open ended. The members may have slots 14 for receiving the contact terminals 20, and a retention or mounting bar 15 disposed longitudinally in said slots for providing support for the socket. The members 12 having essentially coplanar top surfaces and spaced opposing faces with inwardly recessed sections providing guide means such as spaced surfaces 18 for aligning the terminals or leads on the circuit element with the contact terminals of the socket. A slide stop 17 may be provided on one end of each member 12, and insulating pins 16, which define a first slot extending from the top surface of the members 12 a distance along a member face for guiding the leads 11 when the element is inserted in a first direction, may be disposed above the contact terminals 20.

The contact terminal 20 may comprise upper tines 22 having opposing contact surfaces 21 for slidably receiving the leads 11 of the circuit element 10, mounted in a second slot extending from the guide surface 18 at the bottom of the first slot a distance along the member face for guiding the contact leads when the circuit element is slid in a second direction to engage in electrical connection with the contact elements. In a preferred embodiment, the tines are respectively canted to from a V for receiving terminals or leads 11 of the circuit package 10. An additional tine 23 is provided which cooperates with one of tines 21 to fix the contact terminal 20 on the retention or mounting bar 15 of member 12. Opposing retention keys or clips 24 are provided to secure the contact terminals in the member 12. The standoff terminal 25 of the individual contact terminals provide for fixedly mounting the socket, e.g., to a printed circuit board and electrically interconnecting the socket in an electrical circuit. Contact terminals 20 are preferably stamped to provide a plurality of said terminals disposed on a carrier strip 26. The contact terminals are stamped from an electrically conductive metal or metal alloy and may be coated with a tarnish-resistant metallic layer. Additionally the contact surfaces 21 may be coated with a highly conductive metal or metal alloy as may the circuit terminals or leads to insure good electrical contact between said terminals or leads and said contact surfaces. The metal should have sufficient resiliency and spring-like properties to insure maintenance of contact pressure between contact surfaces 21 and terminals or leads 11 on the circuit package 10.

In use, the contact terminals 20 are manually or machine-inserted in the members 12 with the standoff terminals 25 projecting from the bottom of said members. The members are then disposed in an opposing relationship, e.g., on a printed circuit board having a corresponding number of through holes to the socket terminals disposed in each member. Standoff terminal 25 extends through the holes in the circuit board and may be manually or automatically soldered to a pattern disposed on the opposite surface of the circuit board, e.g., by wave or dip soldering. Circuit element 10 may then be inserted in the socket in a first direction so the leads rest on spaced surfaces 18, and then the element is slid in a second direction to engage the leads 11 in electrical interconnection with the contact terminals 20. Slide stop 17 disposed at one end of the opposing member halts the travel of the circuit package when the leads are firmly inserted in the socket terminals and prevents the leads from being pushed through the contact terminals. The element may readily be removed by sliding it in the opposite direction of insertion until released by the contact terminals and then lifted from between opposing members 12.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What is claimed is:

1. A socket for removably receiving a circuit element having a rectangular body and a plurality of leads disposed on opposite sides of said body, said socket comprising a pair of spaced opposing insulating members, each opposing member having a plurality of spaced contact terminals mounted therein, each member having a top surface, a face including a plurality of spaced coplanar guide surfaces recessed from said top surface, and a bottom surface substantially parallel with said top surface and said guide surfaces, a respective guide surface disposed to one side of each contact terminal for receiving each lead when said circuit element is inserted in a first direction and guiding said leads when said circuit element is slid in a second direction to engage said leads in electrical connection with said contact terminals, each of said contact terminals having at least one contact surface for engaging a circuit element lead and a cam surface between said contact surface and its respective guide surface, said cam surface inclined relative to said respective guide surface for facilitating smooth sliding of said leads in said second direction.

2. A socket as recited in claim 1, wherein said face includes an insulated member protruding therefrom adjacent said top surface above each contact terminal, and said contact terminals have at least one contact surface substantially in alignment with said guide surface.

3. A socket according to claim 1, wherein said opposing members have slots for receiving said contact terminals and said contact terminals comprise a pair of tines having opposing contact surfaces for slidably receiving said leads on said circuit element.

4. A socket according to claim 1, wherein said contact terminals additionally include a terminal for electrically interconnecting said socket in an electrical circuit.

5. A socket according to claim 3, wherein said tines are canted to form a vee for receiving said leads.

6. A socket, as recited in claim 2, said insulated members protruding from each face being alternately spaced above said guide surfaces to provide first slots extending perpendicularly from said top surface along said face to said guide surfaces and second intersecting slots extending along each face.

7. A socket, as recited in claim 6, wherein all said second slots extend in the same direction away from their respective first slots.

8. A socket for removably receiving a circuit element having a rectangular body and a plurality of leads disposed on opposite sides of said body, said socket comprising a pair of spaced opposing members, a plurality of spaced contact terminals mounted in said members, and guide means on at least one side of each contact terminal for receiving the leads when the circuit element is inserted in a first direction and guiding said leads when the circuit element is slid in a second direction to engage in the electrical connection with the contact terminals, wherein said opposing members have slots for receiving said contact terminals and said contact terminals comprise a pair of tines having opposing contact surfaces for slidably receiving the leads on the circuit element, and said slots have a longitudinal bar disposed therein and said contact terminals have an additional tine which cooperates with the adjacent tine of said pair of tines to secure said contact terminals in said opposing member.

9. A socket according to claim 8, wherein said additional tine and said adjacent tine have retention tabs for securing said contact terminals in said opposing members.

10. A socket for removably receiving a circuit element having a rectangular body and a plurality of leads disposed on opposing sides of said body, said socket comprising a pair of spaced opposing insulating members, each opposing member having a plurality of spaced contact terminals mounted therein, each member having a top surface, a face including a plurality of spaced coplanar guide surfaces recessed from said top surface and a bottom surface substantially parallel with said top surface and said guide surfaces, said face including an insulating member protruding therefrom adjacent said top surface above each contact terminal, a respective guide surface disposed to one side of each contact terminal for receiving each lead when said circuit element is inserted in a first direction and guiding said leads when said circuit element is slid in a second direction to engage said leads in electrical connection with said contact terminals.

11. A socket, as recited in claim 10, said insulated members protruding from each face being alternately spaced above said guide surfaces to provide first slots extending perpendicularly from said top surface along said face to said guide surfaces and second intersecting slots extending along each face.

* * * * *